United States Patent
Sawyers

(10) Patent No.: US 9,325,133 B2
(45) Date of Patent: Apr. 26, 2016

(54) ELECTRICAL ADAPTER POWER RATING DETERMINATION

(75) Inventor: Thomas Paul Sawyers, Hempstead, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 773 days.

(21) Appl. No.: 13/643,138

(22) PCT Filed: Aug. 4, 2010

(86) PCT No.: PCT/US2010/044463
§ 371 (c)(1),
(2), (4) Date: Oct. 24, 2012

(87) PCT Pub. No.: WO2012/018333
PCT Pub. Date: Feb. 9, 2012

(65) Prior Publication Data
US 2013/0038142 A1     Feb. 14, 2013

(51) Int. Cl.
H01R 31/06     (2006.01)
H01R 13/66     (2006.01)
H01R 13/70     (2006.01)
G01R 19/25     (2006.01)

(52) U.S. Cl.
CPC ............ H01R 31/065 (2013.01); H01R 13/665 (2013.01); H01R 13/6616 (2013.01); H01R 13/70 (2013.01); G01R 19/25 (2013.01); Y10T 307/858 (2015.04)

(58) Field of Classification Search
None
See application file for complete search history.

(56) References Cited

U.S. PATENT DOCUMENTS

| | | | |
|---|---|---|---|
| 5,256,979 A * | 10/1993 | Moorman | 324/713 |
| 6,828,760 B2 | 12/2004 | Massey et al. | |
| 7,126,241 B2 * | 10/2006 | Popescu-Stanesti et al. | 307/29 |
| 7,526,659 B2 | 4/2009 | Sawyers et al. | |
| 7,581,130 B2 * | 8/2009 | Carroll et al. | 713/340 |
| 7,852,043 B2 * | 12/2010 | Kawamoto et al. | 320/106 |
| 7,944,199 B2 * | 5/2011 | Wynne | 324/126 |
| 8,248,261 B1 * | 8/2012 | Stell | 340/662 |
| 8,645,720 B2 * | 2/2014 | Weng et al. | 713/300 |
| 8,796,880 B2 * | 8/2014 | Brooks et al. | 307/31 |
| 2006/0132111 A1 | 6/2006 | Jacobs et al. | |
| 2006/0174143 A1 * | 8/2006 | Sawyers et al. | 713/300 |
| 2008/0116879 A1 * | 5/2008 | Hsieh | 324/115 |
| 2008/0315831 A1 * | 12/2008 | Li et al. | 320/106 |
| 2010/0106983 A1 | 4/2010 | Kasprzak et al. | |

FOREIGN PATENT DOCUMENTS

| | | |
|---|---|---|
| CN | 1369132 A | 9/2002 |
| CN | 1790861 | 6/2006 |
| CN | 101111816 A | 1/2008 |

(Continued)

*Primary Examiner* — Rexford Barnie
*Assistant Examiner* — David Shiao
(74) *Attorney, Agent, or Firm* — HP Patent Department

(57) ABSTRACT

Electronic circuits are provided for use with various electrical adapters. Two resistors define a voltage divider circuit. One or more resistors are coupled in parallel arrangement with the voltage divider by way of controlled switching. A voltage present within the voltage divider is converted into a digital signal, which is used to determine a power rating for the respective electrical adapter. The power rating is used to control normal operations of a computer or other device. The electrical adapter can optionally include a second resistor that is switched into parallel circuit arrangement with a first resistor during the power rating determination process.

16 Claims, 5 Drawing Sheets

(56) References Cited

FOREIGN PATENT DOCUMENTS

| | | |
|---|---|---|
| CN | 101128791 | 2/2008 |
| CN | 101681189 A | 3/2010 |
| DE | 69229639 | 6/2000 |
| EP | 0627084 | 7/1999 |
| TW | 200630631 A | 9/2008 |
| TW | 200836461 A | 9/2008 |
| TW | 200915700 A | 4/2009 |

* cited by examiner

ELECTRICAL ADAPTER POWER RATING DETERMINATION

CROSS-REFERENCE TO RELATED APPLICATION

This application is a national stage application under 35 U.S.C. §371 of PCT/US2010/044463, filed Aug. 10, 2010.

BACKGROUND

Electrical adapters are widely used to convert alternating-current into regulated direct-current for use with laptop computers, cellular telephones and other devices. Electrical adapters are typically designed to provide a constant voltage up to some rated level of output power. The present trend is toward increasing power output capabilities in accordance with the increasing demands of the load devices being served.

However, it is often possible to connect an electrical adapter to a computer or other device that requires a greater power output than the adapter is designed to provide. In another situation, an electrical adapter is capable of serving a respective device during some operating modes, but not others. The present teachings address the foregoing concerns.

BRIEF DESCRIPTION OF THE DRAWINGS

The present embodiments will now be described, by way of example, with reference to the accompanying drawings, in which.

DETAILED DESCRIPTION

Introduction

Means and methods for determining a power rating for an electrical adapter are provided by the present teachings. Circuitry within a laptop computer or other load device digitally samples a voltage present across a sensing resistor. If needed, additional resistance is switched into parallel relationship with the sensing resistor so as to decrease the voltage at the signal node. The lower signal node voltage is digitally sampled and the resulting value used to correlate a power rating for an electrical adapter coupled to the laptop (or other load). One or more operations of the laptop or other load device are controlled or limited in accordance with the determined power delivery capabilities of the electrical adapter.

In one embodiment, an electronic circuit includes a resistor and a switch connected in series circuit relationship. The resistor and the switch are configured to be electrically coupled to at least one power rating component of an electrical adapter. The electronic circuit also includes an analog-to-digital converter configured to provide a digital signal corresponding to a voltage present at a signal node. The signal node is configured to be electrically coupled to the at least one power rating component. The electronic circuit also includes a controller configured to selectively open and close the switch in accordance with the digital signal. The controller is further configured to determine a power rating for the electrical adapter using the digital signal.

In another embodiment, an electrical adapter includes a first resistor and a second resistor defining a voltage divider connected between a first node and a second node. The electrical adapter also includes a third resistor coupled between the first node and a third node. The electrical adapter further includes a fourth resistor and a transistor coupled in series circuit relationship between the first node and the third node. The transistor is biased by way of the voltage divider. The electrical adapter is configured to provide a voltage corresponding to a power rating of the electrical adapter at the third node.

In yet another embodiment, a method includes determining that a first voltage present across at least one resistor lies outside of a predetermined range. The method also includes switching another resistor into parallel circuit arrangement with the at least one resistor. The method also includes converting a second voltage present across the parallel circuit arrangement into a digital signal. The method further includes correlating the digital signal to a power rating for an electrical adapter.

First Illustrative System

Figure 1:
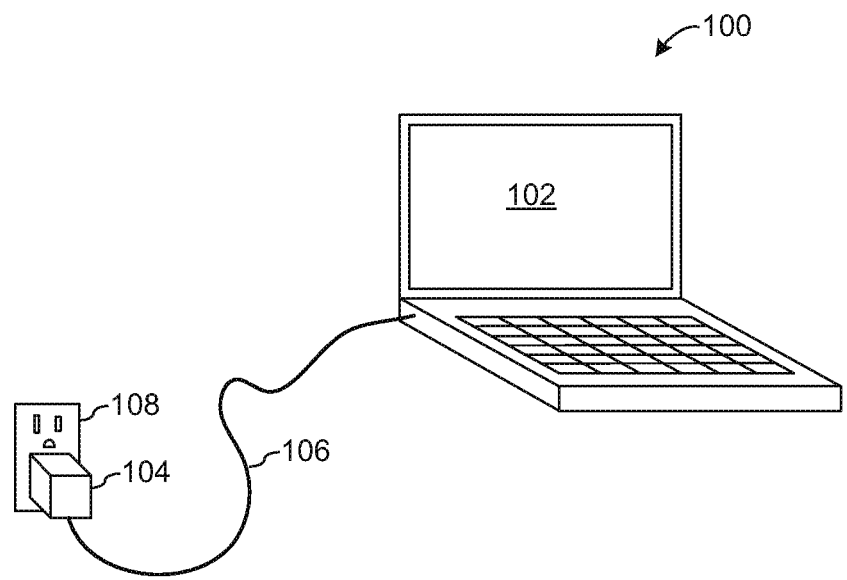
FIG. 1 depicts a diagrammatic view of a system according to one embodiment.

Reference is now directed to FIG. 1, which depicts a diagrammatic view of a system 100. The system 100 is illustrative and non-limiting with respect to the present teachings. Thus, other systems can be configured and/or operated in accordance with the present teachings.

The system 100 includes a laptop computer (laptop) 102. The laptop 102 can be defined by any such device that includes electronic circuitry according to the present teachings. The laptop 102 receives voltage-regulated, direct-current (DC) power from an electrical adapter 104 by way of a connecting cable 106. In turn, the electrical adapter 104 is connected to a source 108 of alternating-current (AC) power. In one embodiment, the electrical adapter 104 is configured to provide nineteen volts DC of regulated power. Other voltages are also possible. The electrical adapter 104 includes circuitry according to the present teachings.

Illustrative operation of the system 100 is as follows: the electrical adapter 104 receives AC power from the source 108 and converts such power in to regulated DC power of one or more substantially constant voltages. The electrical adapter 104 provides this regulated output to the laptop 102 by way of the connecting cable 106. Normal operations of the laptop 102 are energized by way of the power provided by the electrical adapter 104.

Additionally, circuitry of the laptop 102 operates to determine a maximum power rating for the adapter. The power rating can optionally be a continuous operating maximum or a temporary (e.g., ten seconds, etc.) operating maximum. The determined power rating is then used by the laptop 102 in regulating its own operations so as to not exceed the power output capabilities (or limits) of the electrical adapter 104.

Further elaboration regarding illustrative circuitry of the present teachings and normal operations thereof is discussed hereinafter.

First Illustrative Embodiment

Figure 2:
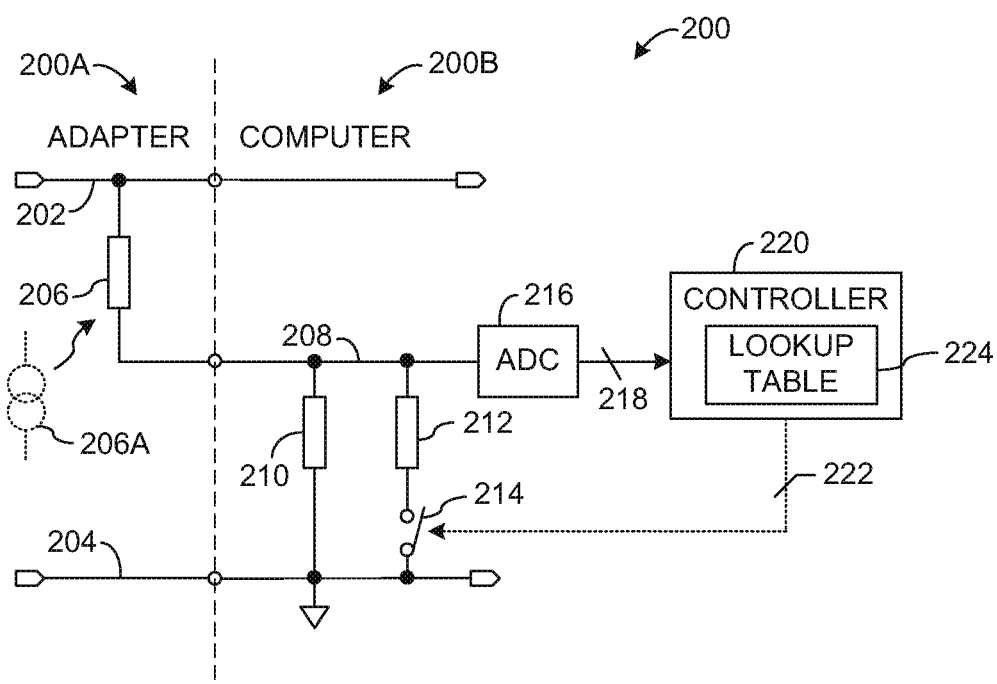
FIG. 2 depicts a schematic diagram of electronic circuitry according to one embodiment.

FIG. 2 is a schematic diagram depicting circuitry 200 according to an embodiment of the present teachings. The circuitry 200 is illustrative and non-limiting in nature. As such, other circuitry is contemplated consistent with the present teachings. The circuitry 200 includes a portion 200A that is provided (i.e., supported or housed) within an electrical adapter (ADAPTER), and a portion 200B that is provided within a laptop computer (COMPUTER). Thus, the circuitry 200 is as depicted when an electrical adapter (e.g., 104) is coupled to a laptop computer (e.g., 102) or other load, respectively, in accordance with the present teachings.

The circuitry portions 200A and 200B are referred to as "compatible" with each other by virtue of their cooperative configurations. Thus, the electrical adapter portion 200A is compatible with the laptop computer (or load) portion 200B, and vice versa.

The circuitry 200 includes a power node 202 and ground node 204. During normal operation, a regulated direct-current voltage is provided between the nodes 202 and 204 by way of known electrical adapter circuitry (not shown).

The adapter portion 200A of the circuitry 200 also includes a resistor 206. The resistor 206 is also referred to as a power rating resistor (or component) 206. In another embodiment, a current source 206A is used in place of the resistor 206 (which is omitted). Such a current source 206A is also referred to as a power rating current source (or component) 206A. The resistor 206 is coupled between the power node 202 and a signal node 208.

The computer portion 200B of the circuitry 200 includes a resistor 210 that is connected between the signal node 208 and the ground node 204. The computer portion 200B of the circuitry 200 also includes a resistor 212 and a switch 214 that are connected in a series circuit arrangement, which in turn is connected between the signal node 208 and the ground node 204. In one embodiment, the switch 214 is defined by a model BSS138 N-channel enhancement mode field effect transistor (FET), as available from Fairchild Semiconductor Corp., San Jose, Calif., USA. Other suitable switches 214 can also be used.

The computer portion 200B of the circuitry 200 also includes an analog-to-digital converter (ADC, or converter) 216. The ADC 216 is configured to monitor the voltage present on the signal node 208 and provide a digital signal (i.e., byte or word) 218 corresponding thereto. The ADC 216 is defined by an operating range within which it can digitally quantify the voltage at signal node 208. The ADC 216 can be defined by any suitable such analog-to-digital converter device and one having ordinary skill in the electrical arts can appreciate the further elaboration is not required.

The computer portion 200B of the circuitry 200 further includes a controller 220. The controller 220 can be defined by any suitable device or circuitry in accordance with the present teachings. For non-limiting example, the controller 220 can include digital, analog or hybrid circuitry, a state machine, a microprocessor or microcontroller, solid-state memory, an application-specific integrated circuit, etc. In one embodiment, the controller 220 is defined by a model SMSC1098 embedded controller, as available from Standard Microsystems Corporation, Hauppauge, N.Y., USA. Other suitable embodiments of the controller 220 can also be used. In one embodiment, the ADC 216 is defined by a portion (or capability) of the controller 220.

The controller 220 is configured to receive the digital signal 218 and to assert a control signal 222 as needed to selectively open and close the switch 214. The controller 220 includes a lookup table 224 storing digital signal 218 values and corresponding electrical adapter power ratings. Table 1 below provides illustrative and non-limiting values for the components of the circuitry 200:

TABLE 1

Circuitry 200

| Element/Device | Value/Model | Notes/Vendor |
|---|---|---|
| Resistor 206 | (See Table 1.1) | (Below) |
| Resistor 210 | 43.2K Ohms | 1%/Any Vendor |
| Resistor 212 | 11.3K Ohms | 1%/Any Vendor |
| Switch 214 | BSS138 | Fairchild Semiconductor |
| Controller 220 | SMSC1098 | Standard Microsystems |

Table 1.1 below provides illustrative and non-limiting values for the power rating resistor 206 and the corresponding power rating of the adapter portion 200A:

TABLE 1.1

Resistor 206

| Power Rating | Resistor 206 | Notes/Vendor |
|---|---|---|
| 350 Watts | 45.8K Ohms | 1%/Any Vendor |
| 310 Watts | 53.5K Ohms | 1%/Any Vendor |
| 270 Watts | 62.3K Ohms | 1%/Any Vendor |
| 230 Watts | 72.8K Ohms | 1%/Any Vendor |
| 200 Watts | 85.2K Ohms | 1%/Any Vendor |
| 180 Watts | 100K Ohms | 1%/Any Vendor |
| 150 Watts | 130K Ohms | 1%/Any Vendor |
| 135 Watts | 169K Ohms | 1%/Any Vendor |
| 120 Watts | 221K Ohms | 1%/Any Vendor |
| 90 Watts | 294K Ohms | 1%/Any Vendor |
| 65 Watts | 383K Ohms | 1%/Any Vendor |
| 50 Watts | 499K Ohms | 1%/Any Vendor |
| 40 Watts | 590K Ohms | 1%/Any Vendor |
| 30 Watts | 698K Ohms | 1%/Any Vendor |
| 20 Watts | 845K Ohms | 1%/Any Vendor |

First Illustrative Method

Figure 3:
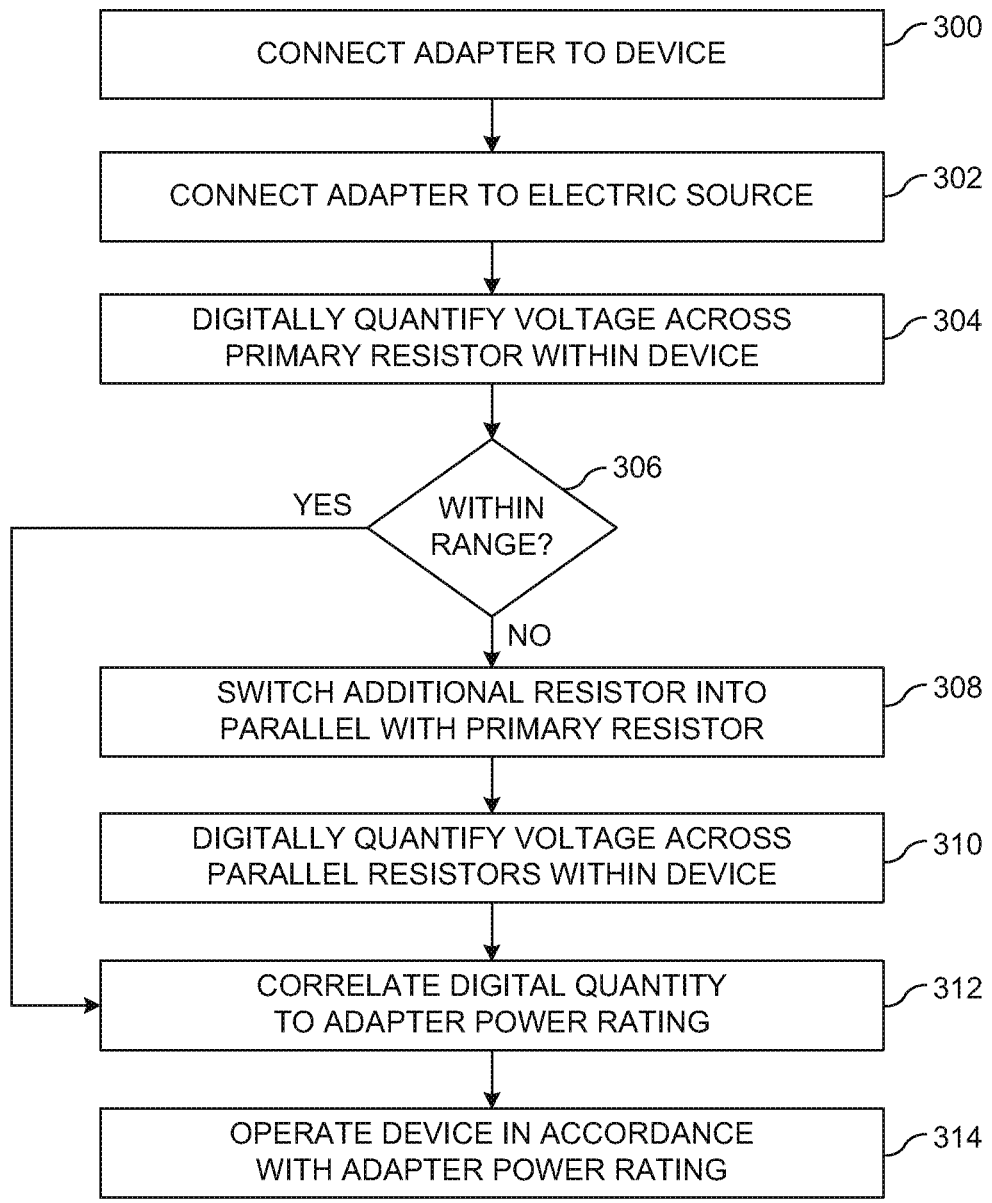
FIG. 3 is a flow diagram depicting a method according to one embodiment.

FIG. 3 is a flow diagram depicting a method according to one embodiment of the present teachings. The method of FIG. 3 includes particular operations and order of execution. However, other methods including other operations, omitting one or more of the depicted operations, and/or proceeding in other orders of execution can also be used according to the present teachings. Thus, the method of FIG. 3 is illustrative and non-limiting in nature. Reference is also made to FIGS. 1-2 in the interest of understanding the method of FIG. 3.

At 300, an electrical adapter is connected to a load device. For purposes of illustrative and non-limiting example, it is assumed that the adapter 104 is connected to the laptop 102 by way of the cable 106. In another scenario, the load device can be a cellular telephone, gaming console, etc.

At 302, the electrical adapter is connected to a source of electrical energy. For purposes of the ongoing example, the electrical adapter 104 is connected (i.e., plugged in) to the electrical source 108. The electrical adapter is now able to provide regulated direct-current energy (e.g., nineteen volts, twenty-four volts, etc.) to the laptop 102 by way of the power node 202 and the ground node 204.

At 304, an electrical voltage present across a "primary" resistor of the load device is digitally quantified. For purposes of the example, the voltage across resistor 210—at signal node 208—is digitized by the ADC 216. It is further assumed that the switch or relay 214 is in an open condition during this operational step.

At 306, it is determined if the voltage digitally quantified at 304 above is within a predetermined operating range. For purposes of the example, the controller 220 evaluates the digital signal 218 to determine if the voltage at node 208 is within or outside of the operating range of the ADC 216. If the voltage at node 208 is within the operating range, then the method proceeds to 312 below. If the voltage at node 208 is outside the operating range, then the method proceeds to 308 below.

At 308, an additional resistor is switched into parallel circuit arrangement with the primary resistor. For purposes of the example, the controller 220 asserts a control signal 222 causing the switch 214 to assume a closed condition. The resistor 212 is now in parallel circuit relationship with the resistor 210. Thus, both resistors 210 and 212 are respectively connected between the signal node 208 and the ground node 204.

At 310, the electrical voltage present across the parallel arrangement of resistors is digitally quantified. For purposes of the example, the voltage across parallel resistors 210 and 212—at signal node 208—is digitized by the analog-to-digital converter 216. The switch 214 is maintained in a closed condition until this operational step is complete, and the switch 214 is then opened.

At 312, the digital signal is correlated to a power rating for the electrical adapter. For purposes of the example, the controller 220 uses the digital signal 218 as derived at 304 or 310 above to determine a power rating for the electrical adapter 104. Specifically, the controller 220 cross-references (i.e., correlates) the digital signal 218 with a corresponding power rating within the lookup table 224. In another embodiment, the controller accesses memory or other storage (not shown) of the computer 102 (or other device) in order to determine the power rating value. Other means and procedures can also be used to determine the power rating of the electrical adapter using the digital signal.

At 314, the load device is operated in accordance with the power rating of the electrical adapter. For purposes of example, software or other means (not shown) of the laptop computer 102 use the power rating to regulate or limit the number or intensity of operations being performed, accordingly. For instance, the laptop 102 may limit the operating frequency of a microprocessor, reduce the current drawn in charging a battery, or halt the use wireless communications while an optical storage drive is being accessed. Other operational protocols and power limiting measures can also be implemented.

The foregoing method is illustrative of any number of methods contemplated by the present teachings. In general, and without limitation, an electrical adapter is connected to computer or other load, and to a source of electricity. Circuitry within the electrical adapter is coupled to circuitry within the load device such that a voltage divider is defined by two respective resistors. A voltage is present on a signal node of the voltage divider and is digitally quantified for evaluation. In an alternative embodiment, a signal voltage is provided by way of a current source within the electrical adapter and a resistor within the load device. If the digital signal is within a usable range, it is used to determine a power rating for the adapter.

If the digital signal is not within the usable range, the overall ratio of the voltage divider is adjusted by way of an additional, parallel resistor. The resulting voltage on the signal node, being different (i.e., lower) than the first voltage, is digitally quantified and used to determine the power rating of the electrical adapter. The power rating can then be used to control or modify the power-consuming behaviors of the load device. Numerous other methods consistent with the operations and/or objectives of the present teachings can also be used.

Second Illustrative Embodiment

Figure 4:
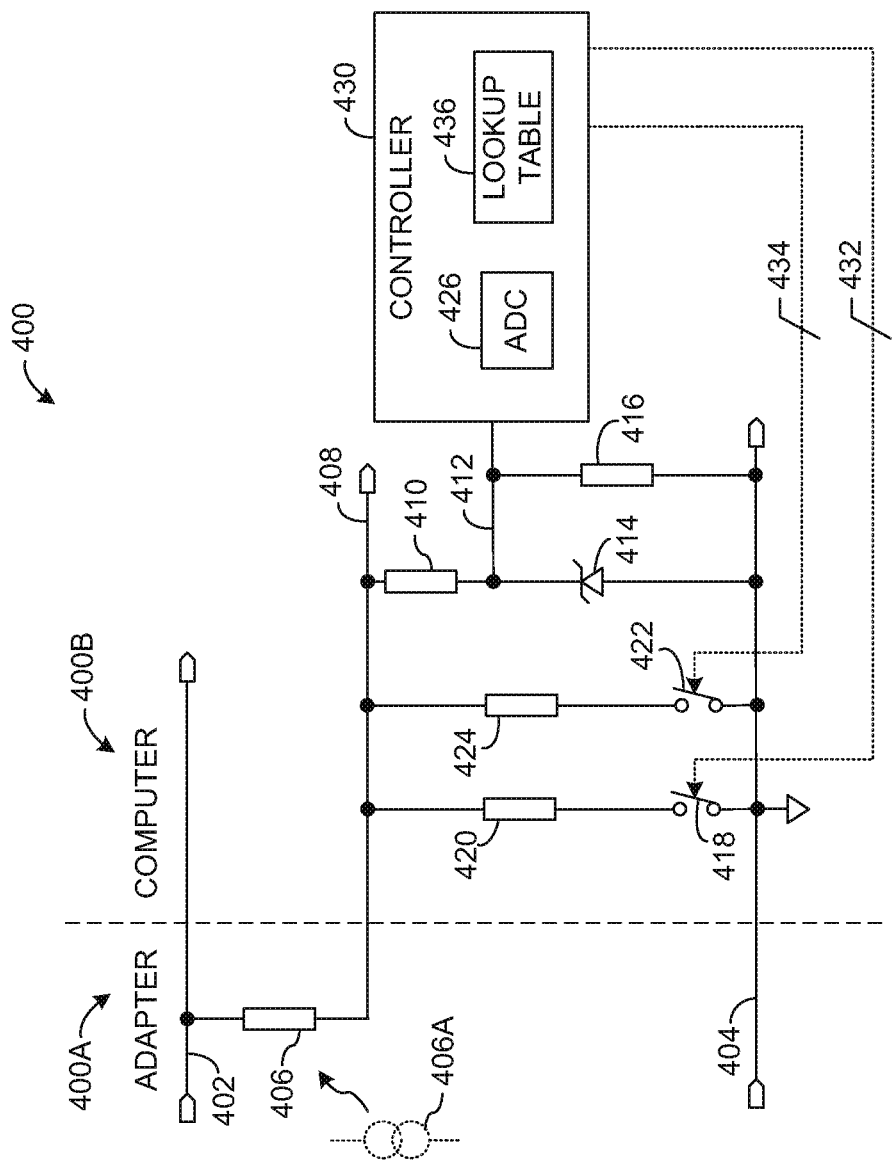
FIG. 4 depicts a schematic diagram of electronic circuitry according to another embodiment.

Attention is now directed to FIG. 4, which is a schematic diagram depicting circuitry 400 according to another embodiment of the present teachings. The circuitry 400 is illustrative and non-limiting in nature. Thus, other circuits can also be defined and used in accordance with the present teachings. The circuitry 400 includes a portion 400A that is provided within an electrical adapter (ADAPTER), and a portion 400B that is provided within a laptop computer (COMPUTER) or other compatible load device. Thus, the circuitry 400 is as depicted when an electrical adapter (e.g., 104) is coupled to a laptop computer (e.g., 102), respectively, in accordance with the present teachings.

The circuitry 400 includes a power node 402 and a ground node 404. During normal operation, a regulated direct-current voltage is provided between the nodes 402 and 404 by way of known electrical adapter circuitry (not shown).

The adapter portion 400A of the circuitry 400 also includes a resistor 406. The resistor 406 is also referred to as a power rating resistor (or component) 406. In another embodiment, a current source 406A or another component is used instead of the resistor 406. The resistor 406 is coupled between the power node 402 and a throttling node 408. The computer portion 400B of the circuitry 400 includes a resistor 410 that is connected between the throttling node 408 and a signal node 412. The computer portion 400B also includes a zener diode 414 and a resistor 416 respectively connected between the signal node 412 and the ground node 404. It is noted that the resistor 410 and the resistor 416 are coupled to define a voltage divider and that the signal node 412 is defined between the resistors 410 and 416. It is noted that other voltage clamping components or circuits can be used in place of zener diode 414.

The computer portion 400B of the circuitry 400 further includes a switch (or relay) 418 and a resistor 420 that are connected in a series circuit arrangement between the throttling node 408 and the ground node 404. In one embodiment, the switch 418 is defined by a model 2N7002 N-channel enhancement mode field effect transistor (FET), as available from Fairchild Semiconductor Corp., San Jose, Calif., USA. Other suitable switches 418 can also be used.

Additionally, the computer portion 400B includes another switch (or relay) 422 and another resistor 424 connected in a series circuit arrangement between the throttling node 408 and the ground node 404. In one embodiment, the switch 422 is defined by a model BSS138 N-channel enhancement mode field effect transistor (FET), as available from Fairchild Semiconductor Corp., San Jose, Calif., USA. Other suitable switches 422 can also be used. As such, the computer portion 400B of the circuitry 400 includes two separate and distinct series circuit paths connected between the nodes 408 and 404, each path consisting of a resistor and a controllable switch.

The computer portion 400B of the circuitry 400 further includes an analog-to-digital converter (ADC, or converter) 426. The ADC 426 is configured to monitor the voltage present on the signal node 412 and provide a digital signal corresponding thereto. The ADC 426 is defined by an operating range within which it can digitally quantify (i.e., digitize) the voltage at signal node 412.

The computer portion 400B of the circuitry 400 further includes a controller 430. The controller 430 can be defined by any suitable device or circuitry in accordance with the present teachings. For non-limiting example, the controller 430 can include digital, analog or hybrid circuitry, a state machine, a microprocessor or microcontroller, solid-state memory, an application-specific integrated circuit, etc. Other suitable embodiments of the controller 430 can also be used. As shown, the ADC 426 is a portion (i.e., resource or subsystem) of the controller 430. In one embodiment, the controller 430 is defined by a model SMSC1098 embedded controller, as available from Standard Microsystems Corporation, Hauppauge, N.Y., USA.

The controller 430 is configured to receive the digital signal from the ADC 426 and to selectively assert a control signal 432 and a control signal 434 as needed to independently open and close the switches 418 and 422, respectively. The controller 430 includes a lookup table 436 that stores digital signal values and corresponding electrical adapter power ratings. Table 2 below provides illustrative and non-limiting values for the components of the circuitry 400:

TABLE 2

Circuitry 400

| Element/Device | Value/Model | Notes/Vendor |
| --- | --- | --- |
| Resistor 406 | (See Table 1.1) | (Above) |
| Resistor 410 | 10.0K Ohms | 1%/Any Vendor |
| Zener 414 | 3.3 Volts | Any Vendor |
| Resistor 416 | 71.5K Ohms | 1%/Any Vendor |
| Switch 418 | 2N7002 | Fairchild Semiconductor |
| Resistor 420 | 27.4K Ohms | 1%/Any Vendor |
| Switch 422 | BSS138 | Fairchild Semiconductor |
| Resistor 424 | 9.76K Ohms | 1%/Any Vendor |
| Controller 430 | SMSC1098 | Standard Microsystems |

Normal operation of the circuitry 400 is similar to that described above in regard to the method of FIG. 3 and the circuitry 200. However, the resistors 410 and 416 define a voltage divider, which in turn defines the signal node 412. Additionally, the resistors 420 and 424 can be independently switched (either or both) into parallel circuit arrangement with the voltage divider defined by resistors 410 and 416. In this way, the controller 430 can reduce the voltage at signal node 412 in an discrete step-wise manner until a digital signal value is provided that can be cross-referenced to an electrical adapter power rating within the lookup table 436. Thus, the computer portion 400B can be used to determine the power rating of a numerous different electrical adapters respectively inclusive of the adapter portion 400A. The present teachings contemplate other circuitry embodiments (not shown) having any usable number of resistors that are discretely and selectively switched into and out of circuit arrangements during an operation to determine an adapter power rating.

Third Illustrative Embodiment

Figure 5:
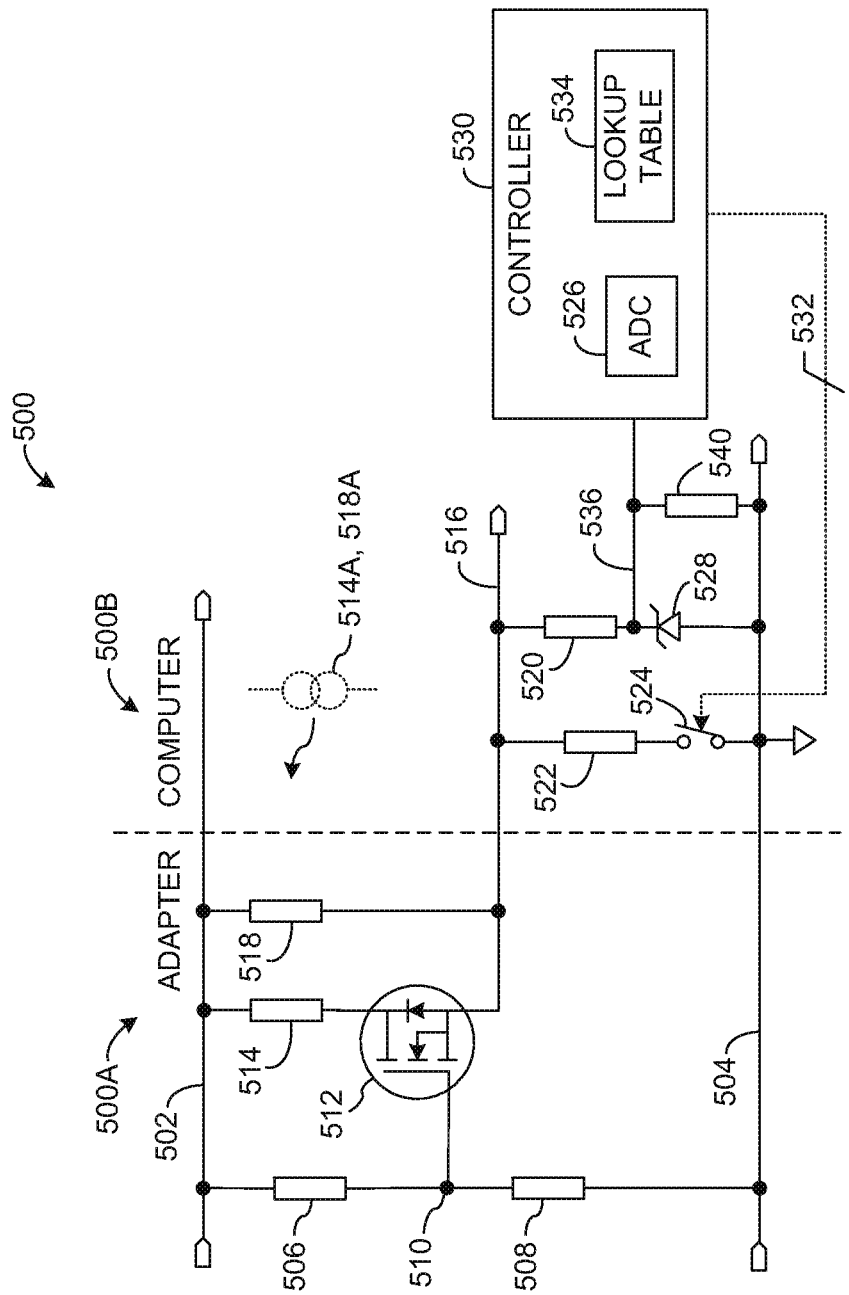
FIG. 5 depicts a schematic diagram of electronic circuitry according to yet another embodiment.

Reference is now directed to FIG. 5, which is a schematic diagram depicting circuitry 500 according to another embodiment of the present teachings. The circuitry 500 is illustrative and non-limiting in nature. Thus, other circuits can also be defined and used according to the present teachings. The circuitry 500 includes a portion 500A that is provided within an electrical adapter (ADAPTER), and a portion 500B that is provided within a laptop computer (COMPUTER) or other compatible load. Thus, the circuitry 500 is as depicted when an electrical adapter (e.g., 104) is coupled to a laptop computer (e.g., 102), respectively, in accordance with the present teachings.

The adapter portion 500A includes a power node 502 and a ground node 504. During normal operation, a regulated direct-current voltage is provided between the nodes 502 and 504 by way of known electrical adapter circuitry (not shown). The adapter portion 500A also includes a pair of resistors 506 and 508 defining a voltage divider that is coupled between the power node 502 and the ground node 504. The resistors 506 and 508 further define a voltage divider output node 510.

The adapter portion 500A of the circuitry 500 also includes a transistor 512 and a resistor 514 coupled in series circuit arrangement between the power node 502 and a throttling node 516. The transistor 512 is coupled so as to be biased by a voltage present at the node 510. In one embodiment, the transistor 512 is defined by a model BSS138 N-channel enhancement mode field effect transistor (FET), as available from Fairchild Semiconductor Corp., San Jose, Calif., USA. Other suitable transistors can also be used. The adapter portion 500A further includes a resistor 518 coupled between the power node 502 and the throttling node 516. The resistor 514 and the resistor 518 are also referred to as a power rating resistor 514 and a power rating resistor 518, respectively. In another embodiment, either or both of the resistors 514 and 518 is/are replaced with a current source 514A or 518A, respectively.

The computer portion 500B of the circuitry 500 includes a resistor 520 and a zener diode 528 that are series connected between the throttling node 516 and the ground node 504. The zener diode 528 serves as a voltage clamp or limiter. It is noted that other voltage clamping components or circuits can be used in place of zener diode 528. A signal node 536 is defined between the resistor 520 and the zener diode 528. The computer portion 500B further includes a resistor 540 connected between the signal node 536 and the ground node 504. It is noted that the resistors 520 and 540 are electrically coupled to define a voltage divider, and that the signal node 536 is defined there between.

The computer portion 500B also includes a resistor 522 and a switch (or relay) 524 that are connected in a series circuit arrangement between the throttling node 516 and the ground node 504. In one embodiment, the switch 524 is defined by a model BSS138 N-channel field effect transistor, as available from Fairchild Semiconductor Corp. Other suitable switches can also be used.

The computer portion 500B includes an analog-to-digital converter 526. The ADC 526 is configured to monitor the voltage present on the signal node 536 and to provide a corresponding digital signal. The ADC 526 is defined by an operating range as described above.

The computer portion 500B of the circuitry 500 further includes a controller 530. The controller 530 can be defined by any suitable device or circuitry in accordance with the present teachings. For non-limiting example, the controller 530 can include digital, analog or hybrid circuitry, a state machine, a microprocessor or microcontroller, solid-state memory, an application-specific integrated circuit, etc. As shown, the ADC 526 is a portion (i.e., resource or subsystem) of the controller 530. In one embodiment, the controller 530 is defined by a model SMSC1098 embedded controller, as available from Standard Microsystems Corporation. Other suitable embodiments of the controller 530 can also be used.

The controller 530 is configured to use the digital signal from the ADC 526 to assert a control signal 532 as needed to selectively open and close the switch 524. The controller 530 includes a lookup table 534 storing digital signal 528 values and corresponding electrical adapter power ratings. Table 3 below provides illustrative and non-limiting values for the components of the circuitry 500:

TABLE 3

Circuitry 500

| Element/Device | Value/Model | Notes/Vendor |
| --- | --- | --- |
| Resistor 506 | 200K Ohms | 1%/Any Vendor |
| Resistor 508 | 100K Ohms | 1%/Any Vendor |
| Transistor 512 | BSS138 | Fairchild Semiconductor |
| Resistor 514 | (See Table 3.1) | (Below) |
| Resistor 518 | (See Table 3.1) | (Below) |
| Resistor 520 | 16.9K Ohms | 1%/Any Vendor |
| Resistor 522 | 13.0K Ohms | 1%/Any Vendor |
| Switch 524 | BSS138 | Fairchild Semiconductor |

TABLE 3-continued

Circuitry 500

| Element/Device | Value/Model | Notes/Vendor |
| --- | --- | --- |
| Zener 528 | 3.3 Volts | Any Vendor |
| Controller 530 | SMSC1098 | Standard Microsystems |
| Resistor 540 | 45.3K Ohms | 1%/Any Vendor |

Table 3.1 below provides illustrative and non-limiting values for the resistors 514 and 518, respectively, of the adapter portion 500A of the circuitry 500:

TABLE 3.1

Resistors 514 and 518

| Power Rating | Resistor 514 | Resistor 518 | Notes |
| --- | --- | --- | --- |
| 350 Watts | 84.5K Ohms | 100K Ohms | 1%/Any |
| 310 Watts | 115K Ohms | 100K Ohms | 1%/Any |
| 270 Watts | 165K Ohms | 100K Ohms | 1%/Any |
| 230 Watts | 267K Ohms | 100K Ohms | 1%/Any |
| 200 Watts | 576K Ohms | 100K Ohms | 1%/Any |
| 180 Watts | (Open Circuit) | 100K Ohms | 1%/Any |
| 150 Watts | (Open Circuit) | 130K Ohms | 1%/Any |
| 135 Watts | (Open Circuit) | 169K Ohms | 1%/Any |
| 120 Watts | (Open Circuit) | 221K Ohms | 1%/Any |
| 90 Watts | (Open Circuit) | 294K Ohms | 1%/Any |
| 65 Watts | (Open Circuit) | 383K Ohms | 1%/Any |
| 50 Watts | (Open Circuit) | 499K Ohms | 1%/Any |
| 40 Watts | (Open Circuit) | 590K Ohms | 1%/Any |
| 30 Watts | (Open Circuit) | 698K Ohms | 1%/Any |
| 20 Watts | (Open Circuit) | 845K Ohms | 1%/Any |

Second Illustrative Method

Figure 6:
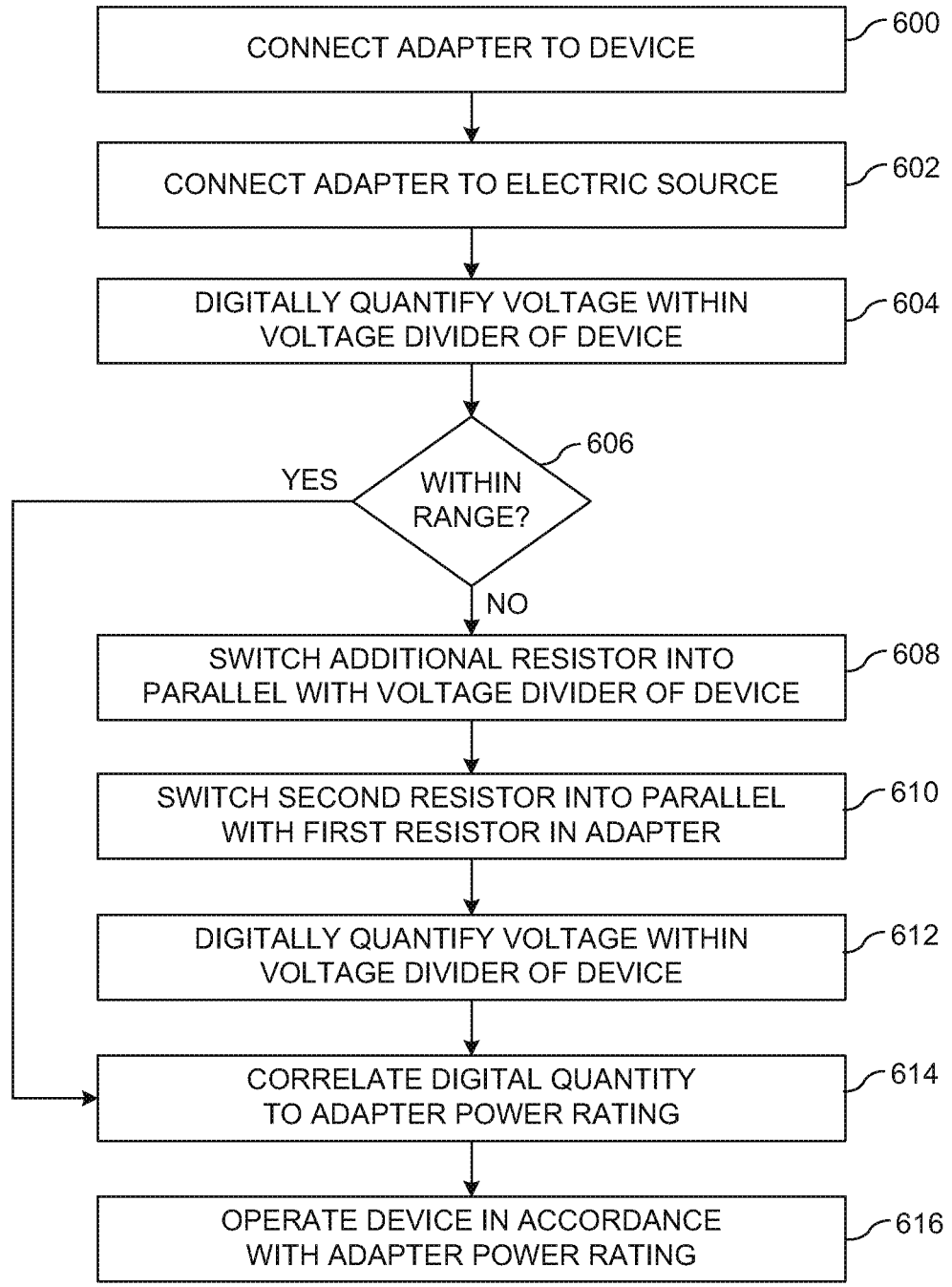
FIG. 6 is a flow diagram depicting a method according to an embodiment.

FIG. 6 is a flow diagram depicting a method according to one embodiment of the present teachings. The method of FIG. 6 includes particular operations and order of execution. However, other methods including other operations, omitting one or more of the depicted operations, and/or proceeding in other orders of execution can also be used according to the present teachings. Thus, the method of FIG. 6 is illustrative and non-limiting in nature. Reference is also made to FIGS. 1 and 5 in the interest of understanding the method of FIG. 6.

At 600, an electrical adapter is connected to a load device. For purposes of illustrative and non-limiting example, it is assumed that the adapter 104 is connected to the laptop 102 by way of the cable 106. In another scenario, the load device can be a cellular telephone, desktop appliance, etc.

At 602, the electrical adapter is connected to a source of electrical energy. For purposes of the ongoing example, the electrical adapter 104 is connected (i.e., plugged in) to the electrical source 108. The electrical adapter is now able to provide regulated direct-current energy (e.g., fifteen volts, twenty-four volts, etc.) to the laptop 102 by way of the power node 502 and the ground node 504.

At 604, an electrical voltage present within a voltage divider of the load device is digitally quantified. For purposes of the example, the voltage at signal node 536 is digitized by the analog-to-digital converter 526. It is further assumed that the switch or relay 524 is in an open condition during this operational step.

At 606, it is determined if the voltage digitally quantified at 604 above is within a predetermined operating range. For purposes of the example, the controller 530 evaluates the digital signal to determine if the voltage at node 536 is within or outside of the operating range of the ADC 526. If the voltage at node 536 is within the operating range, then the method proceeds to 614 below. If the voltage at node 536 is outside the operating range, then the method proceeds to 608 below.

At 608, an additional resistor is switched into parallel circuit arrangement with the voltage divider of the load device. For purposes of the example, the controller 530 asserts a control signal 532 causing the switch 524 to close. The resistor 522 is now electrically coupled between nodes 516 and 504 as a result.

At 610, an additional resistor is switched into parallel with a resistor of the electrical adapter. For purposes of the example, the operation at 608 above causes a decrease in the voltage at the throttling node 516. Before the decrease in voltage, the voltage at node 510 and voltage at node 516 caused transistor 512 to be electrically non-conductive. This voltage decrease, in combination with the voltage present at node 510, causes a forward-biased (i.e., fully-on or saturated) condition of the transistor 512. As a result, resistor 514 is now in parallel circuit arrangement with the resistor 518 of the adapter portion 500A of the circuitry 500. The voltage at the throttling node 516 is increased by this action. However, the transistor 512 remains forward-biased despite the increase in voltage at the throttling node 516.

At 612, the electrical voltage present within the voltage divider of the load device is digitally quantified. For purposes of the example, the voltage at signal node 536 is digitized by the ADC 526. The switch 524 is maintained in a closed condition until this operational step is complete, and the switch 524 is then opened. The opening of the switch 524 causes a further voltage increase at the throttling node 516, which in turn halts the forward-biased condition of the transistor 512.

At 614, the digital signal is correlated to a power rating for the electrical adapter. For purposes of the example, the controller 530 uses the digital signal as derived at 604 or 612 above to determine a power rating for the electrical adapter 104. Specifically, the controller 530 cross-references (i.e., correlates) the digital signal with a corresponding power rating within the lookup table 534. In another embodiment, the controller accesses memory or other storage (not shown) of the computer 102 (or other device) in order to determine the power rating value. Other means and procedures can also be used.

At 616, the load device is operated in accordance with the power rating of the electrical adapter. For purposes of example, software or other means (not shown) of the laptop computer 102 use the power rating to regulate or limit the number or intensity of operations being performed, accordingly. For instance, the laptop 102 may limit the operating frequency of a microprocessor, etc. Other operational protocols or measures can also be implemented.

In general, the foregoing description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

What is claimed is:

1. An electronic circuit, comprising:
   a first resistor connected between a signal node and a ground node, the signal node to be electrically coupled to at least one power rating component of an electrical adapter, wherein the electronic circuit is included in an electronic device to receive electrical power from the electrical adapter;
   a second resistor and a switch connected in series circuit relationship between the signal node and the ground node;
   an analog-to-digital converter to provide a digital signal corresponding to a voltage present at the signal node; and
   control circuitry to, in response to determining that the voltage present at the signal node is outside an operating range:
      close the switch; and
      while the switch is closed, determine a power rating for the electrical adapter using the digital signal.

2. The electronic circuit according to claim 1, the at least one power rating component including a resistor, or a current source.

3. The electronic circuit according to claim 1, the electrical adapter configured to be coupled to a source of alternating-current electrical energy.

4. The electronic circuit according to claim 1, the controller further configured to determine the power rating of the electrical adapter using a lookup table.

5. The electronic circuit according to claim 4, the electronic circuit being part of a computer, the lookup table being provided as a computer-readable code stored within the computer.

6. The electronic circuit according to claim 1, further comprising a second switch connected in series circuit relationship with the first resistor.

7. The electronic circuit according to claim 1, the control circuitry further to, in response to determining that the voltage present at the signal node is within the operating range:
   cause the switch to remain open; and
   while the switch is open, determine a second power rating for the electrical adapter using the digital signal.

8. The electronic circuit according to claim 6, the controller further configured to selectively open and close the second switch based on whether or not the digital signal represents a voltage outside of a predetermined range.

9. The electronic circuit according to claim 1 further comprising a voltage clamping component electrically coupled to the signal node.

10. The electronic circuit according to claim 9, the the electronic device to control one or more operations based on the power rating of the electrical adapter.

11. A method, comprising:
    generating, by an electronic device connected to an electrical adapter, a first digital signal indicating a first voltage present at a signal node of the electronic device, the electronic device comprising a first resistor connected between the signal node and a ground node, the electronic device further comprising a second resistor and a switch connected in series between the signal node and the ground node;
    determining, based on the digital signal, that the first voltage present at the signal node when the switch is in an open position lies outside of a predetermined range;
    in response to a determination that the first voltage present at the signal node is not within the specified operating range, closing the switch;
    while the switch is closed, converting a second voltage present at the signal node into a second digital signal; and
    correlating the second digital signal to a power rating for the electrical adapter.

12. The method according to claim 11 further comprising controlling one or more operations of an electrical load in accordance with the power rating.

13. The method according to claim 11, further comprising:
    in response to a determination that the voltage present at the signal node is within the specified operating range, causing the switch to remain open; and
    correlating the first digital signal to the power rating for the electrical adapter, wherein the signal node is electrically coupled to a power rating component of the electrical adapter.

14. An electronic device, comprising:
    a power connector to couple to a power adapter;
    an electronic circuit, comprising:
       a first resistor connected between a signal node and a ground node, the signal node to be electrically coupled to at least one power rating component of an electrical adapter, wherein the electronic circuit is included in an electronic device to receive electrical power from the electrical adapter;
       a second resistor and a switch connected in series circuit relationship between the signal node and the ground node;
       an analog-to-digital converter to provide a digital signal corresponding to a voltage present at the signal node; and
       a control circuit to:
          determine, using the digital signal, whether the voltage present at the signal node is within a specified operating range;
          cause the switch to remain open in response to a determination that the voltage present at the signal node is within the specified operating range;
          cause the switch to close in response to a determination that the voltage present at the signal node is not within the specified operating range; and
          subsequent to causing the switch to open or close, determine a power rating for the electrical adapter using the digital signal.

15. The electronic device according to claim 14, the control circuit further to control one or more operations of an electrical load in accordance with the power rating.

16. The electronic device according to claim 14, the control circuit further to determine the power rating of the electrical adapter using a lookup table.

* * * * *